United States Patent
Price et al.

(10) Patent No.: US 12,332,327 B1
(45) Date of Patent: Jun. 17, 2025

(54) NUCLEAR MAGNETIC RESONANCE (NMR) SPECTROMETER WITH REPLACEABLE HORIZONTAL SAMPLE TUBE

(71) Applicant: Q Magnetics, LLC, Louisville, CO (US)

(72) Inventors: John C. Price, Longmont, CO (US); Hilton W. Chan, Aurora, CO (US)

(73) Assignee: Q Magnetics, LLC, Broomfield, CO (US)

( * ) Notice: Subject to any disclaimer, the term of this patent is extended or adjusted under 35 U.S.C. 154(b) by 58 days.

(21) Appl. No.: 17/856,798

(22) Filed: Jul. 1, 2022

Related U.S. Application Data

(60) Provisional application No. 63/218,464, filed on Jul. 5, 2021.

(51) Int. Cl.
*G01R 33/30* (2006.01)
*G01R 33/46* (2006.01)

(52) U.S. Cl.
CPC ........... *G01R 33/307* (2013.01); *G01R 33/46* (2013.01)

(58) Field of Classification Search
CPC .............................. G01R 33/307; G01R 33/46
USPC ........................................................ 324/307
See application file for complete search history.

(56) References Cited

U.S. PATENT DOCUMENTS

| | | | |
|---|---|---|---|
| 8,729,898 B2 | 5/2014 | Price et al. | |
| 8,754,646 B2 * | 6/2014 | Price | G01R 33/445 324/322 |
| 8,847,596 B2 | 9/2014 | Price et al. | |
| 11,075,027 B1 | 7/2021 | Price et al. | |
| 2011/0001474 A1 * | 1/2011 | Miller | G01R 33/44 324/306 |

(Continued)

OTHER PUBLICATIONS

F. Bloch, O. Cugat, G. Meunier (Laboratoire d'Electrotechique de Grenoble—UMS CNRS 5529, LEG-ENSIEG, BP 46-38402 Saint Martin d'Heres Cedex, France) and J.C. Toussaint (Latoratoire de Magnetisme Louis Neel—UPR CNRS 5051, BP166—38042 Grenoble Cedex, France), "Innovating Approaches to the Generation of Intense Magnetic Fields: Design and Optimization of a 4 Tesla Permanent Magnet Flux Source", IEEE Transactions on Magnetics, vol. 34, No. 5, Sep. 1998.

(Continued)

*Primary Examiner* — Christopher P McAndrew
(74) *Attorney, Agent, or Firm* — James R. Young; Cochran Freund & Young LLC

(57) ABSTRACT

An NMR spectrometer comprises magnetic field producing apparatus for producing a homogenous magnetic field along a magnetic field axis and an elongate sample tube guide extending along a horizontal sample axis through the magnetic field axis in the homogenous magnetic field. A radio frequency coil is positioned around the sample tube guide where the sample tube guide intersects the magnetic field axis. An elongate sample tube is removably inserted into the sample tube guide for positioning a sample in the homogenous magnetic field at a location where the radio frequency coil surrounds the sample tube guide. The magnetic field producing apparatus and the sample tube guide are mounted inside an enclosure. The removable sample tube is connected at one end to a first union mounted in a sidewall of the enclosure and at the other end to a second union mounted in the sidewall of the enclosure. The first and second unions are higher than the horizontal sample tube guide.

15 Claims, 5 Drawing Sheets

(56) References Cited

U.S. PATENT DOCUMENTS

| | | | | |
|---|---|---|---|---|
| 2011/0316535 A1* | 12/2011 | Price | .................. | G01R 33/3875 |
| | | | | 324/322 |
| 2012/0001636 A1* | 1/2012 | Price | .................... | G01R 33/302 |
| | | | | 324/321 |
| 2013/0088232 A1* | 4/2013 | Inukai | .................... | G01R 33/30 |
| | | | | 324/321 |
| 2022/0171004 A1* | 6/2022 | Freytag | .............. | G01R 33/3804 |

OTHER PUBLICATIONS

Jae Seop Ryu and Young Jun Shin (Electrotechnology R&D Center, LS Industrial Systems Company, Ltd., Cheongju 361-720, Korea), Yingying Yao (College of Electrical Engineering, Zhejian University, Zhejian 310021, China), Chang Seop Koh (School of Electrical and Computer Engineering, Chungbuk National University, Chungbuk 361-763, Korea), "3-D Optimal Shape Design of Pole Piece in Permanent Magnet MRI Using Parameterized Nonlinear Design Sensitivity Analysis", 2006 IEEE 0018-9464, DOI 10.1109/TMAG. 2006.871563.

Zheng Wang, Wen Hui Yang, Xiao Bing Zhang, Li Li Hu, Hui Xian Wang, and Yu Xia Zhang, "Design and Manufacture of a Near 3 T High Field Permanent Magnet Assembly", IEEE Transactions on Applied Superconductivity, vol. 22, No. 3, Jun. 2012.

\* cited by examiner

NUCLEAR MAGNETIC RESONANCE (NMR) SPECTROMETER WITH REPLACEABLE HORIZONTAL SAMPLE TUBE

BACKGROUND

Technical Field of the Invention

The present invention is related to nuclear magnetic resonance (NMR) spectrometers, and more particularly to NMR spectrometers that are relatively small and easy to use.

State of the Prior Art

Use of nuclear magnetic resonance (NMR) for spectroscopic analysis of the molecular compositions and structures of materials is a well-known technology that is especially suited for analysis of organic molecules in liquid phase. NMR spectroscopy requires a stable, high-strength, magnetic field with good magnetic field homogeneity to generate high-quality spectra. For most research spectrometer applications, superconducting magnets are used to provide such stable, high-strength magnetic fields, typically greater than seven (7) Tesla, with good homogeneity. However, superconducting magnets require cryogenic temperatures and specially-trained staff to operate them, thus are high initial cost instruments and expensive to maintain and operate. In typical installations, such superconducting magnet equipped NMR spectrometer instruments are housed in a dedicated facility and are shared among many researchers.

To lower initial costs and make NMR spectroscopy more available to a wider range of users and applications, there have been recent developments of less complex, smaller, and less expensive NMR spectrometer equipment, mostly with permanent magnets, instead of superconducting magnets, to create the required magnetic fields. Permanent magnets cannot create magnetic fields as strong as superconducting magnets, but magnetic fields as high as 5.16 Tesla have been achieved with permanent magnets, as reported in Masyuki Kumada, IEEE TRANSACTIONS ON APPLIED SUPERCONDUCTIVITY, Vol. 14, No. 2, June 2004. However, magnetic fields produced by permanent magnets with sufficient homogeneity to be suitable for NMR spectroscopy have so far not exceeded 2.94 Tesla, and a uniform magnetic field of at least one (1) Tesla is generally needed for sufficient NMR spectral dispersion and sensitivity to be useful for NMR spectrometers. Therefore, while NMR spectrometers based on permanent magnets with magnetic fields in a range of about one (1) to nearly three (3) Tesla provide less spectral dispersion and lower sensitivity than spectrometers based on the higher magnetic field strengths achievable with superconducting magnets, they are advantageously smaller, less expensive to purchase, and do not require dedicated facilities or highly trained staff to maintain and operate them. Consequently, such smaller, less complex, and less expensive NMR spectrometers are available to a wider range of users and are being applied to a wider range of uses than would be practical with superconducting magnet NMR spectrometers. Several recent examples of improvements in NMR spectrometers that do not use superconducting magnets include the U.S. Pat. No. 8,729,898, entitled "Shim Coils and Shimming Miniaturized Nuclear Magnetic Resonance Magnets," U.S. Patent Application Publication No. US 2012/0001636 A1 entitled "Capillary Cartridge For Miniaturized Nuclear Magnetic Resonance (NMR) Devices," U.S. Patent Application Publication No. US 2017/02584866 entitled "Low-Stray-Field Permanent Magnet Arrangement for MR Apparatuses," and U.S. patent application Ser. No. 16/460,783 entitled "Permanent Magnet for Generating Homogenous and Intense Magnetic Field" filed on Jul. 2, 2019.

The foregoing examples of the related art and limitations related therewith are intended to be illustrative and not exclusive. Other limitations of the related art and other examples of related art will become apparent to those of skill in the art upon a reading of the specification and a study of the drawings.

BRIEF DESCRIPTION OF THE DRAWINGS

The accompanying drawings, which are incorporated herein and form a part of the specification, illustrate some, but not the only or exclusive, example embodiments and/or features. It is intended that the embodiments and figures disclosed herein are to be considered illustrative rather than limiting. In the drawings.

DETAILED DESCRIPTIONS OF EXAMPLE EMBODIMENTS

Figure 1:
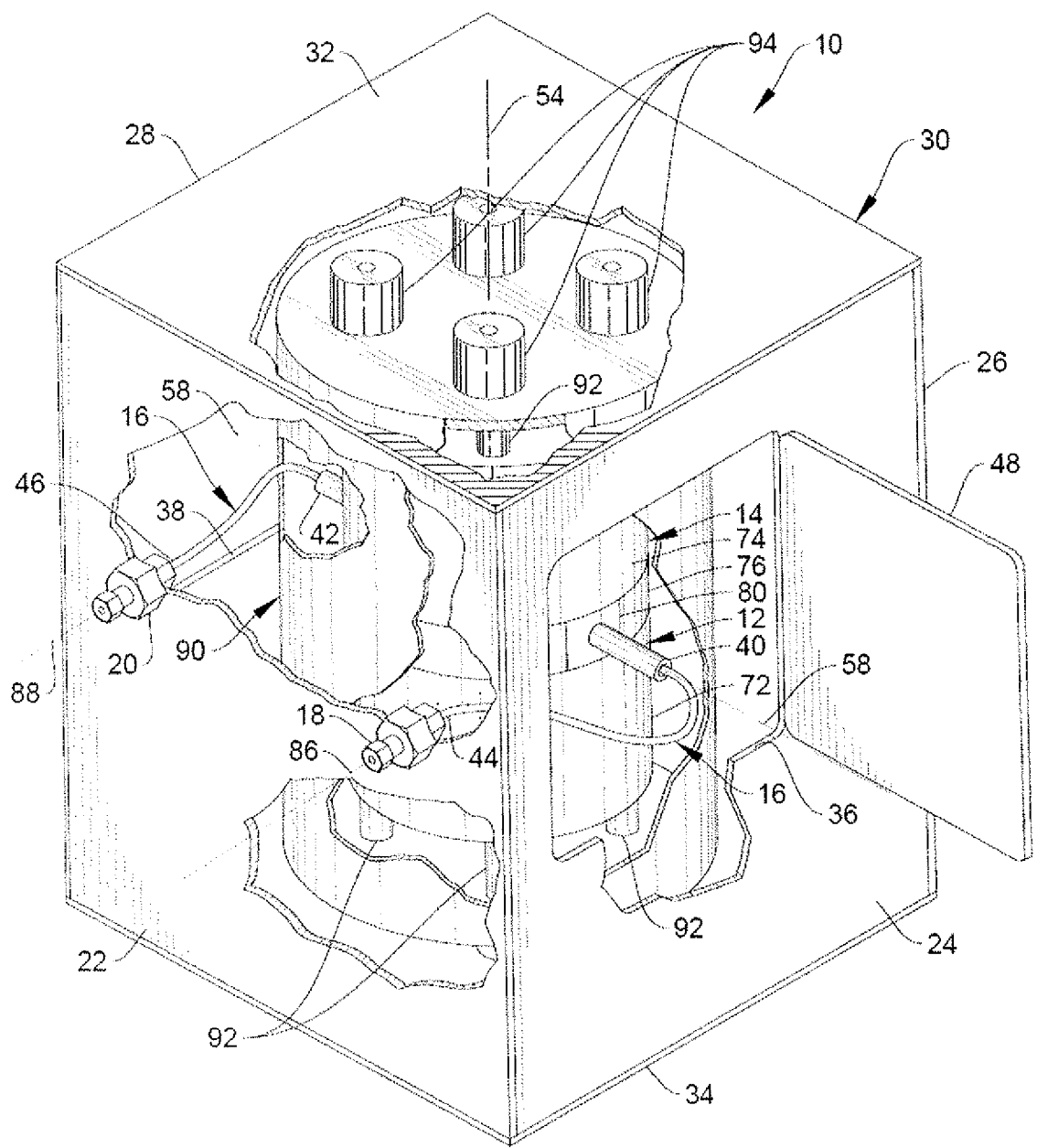
FIG. 1 is an isometric view of an example nuclear magnetic resonance spectrometer with a horizontal replaceable sample tube, portions of the housing and portions of the thermal enclosure in the housing being cut away to reveal components of the example magnet field producing apparatus, replaceable sample tube, and sample tube guide.
Figure 2:
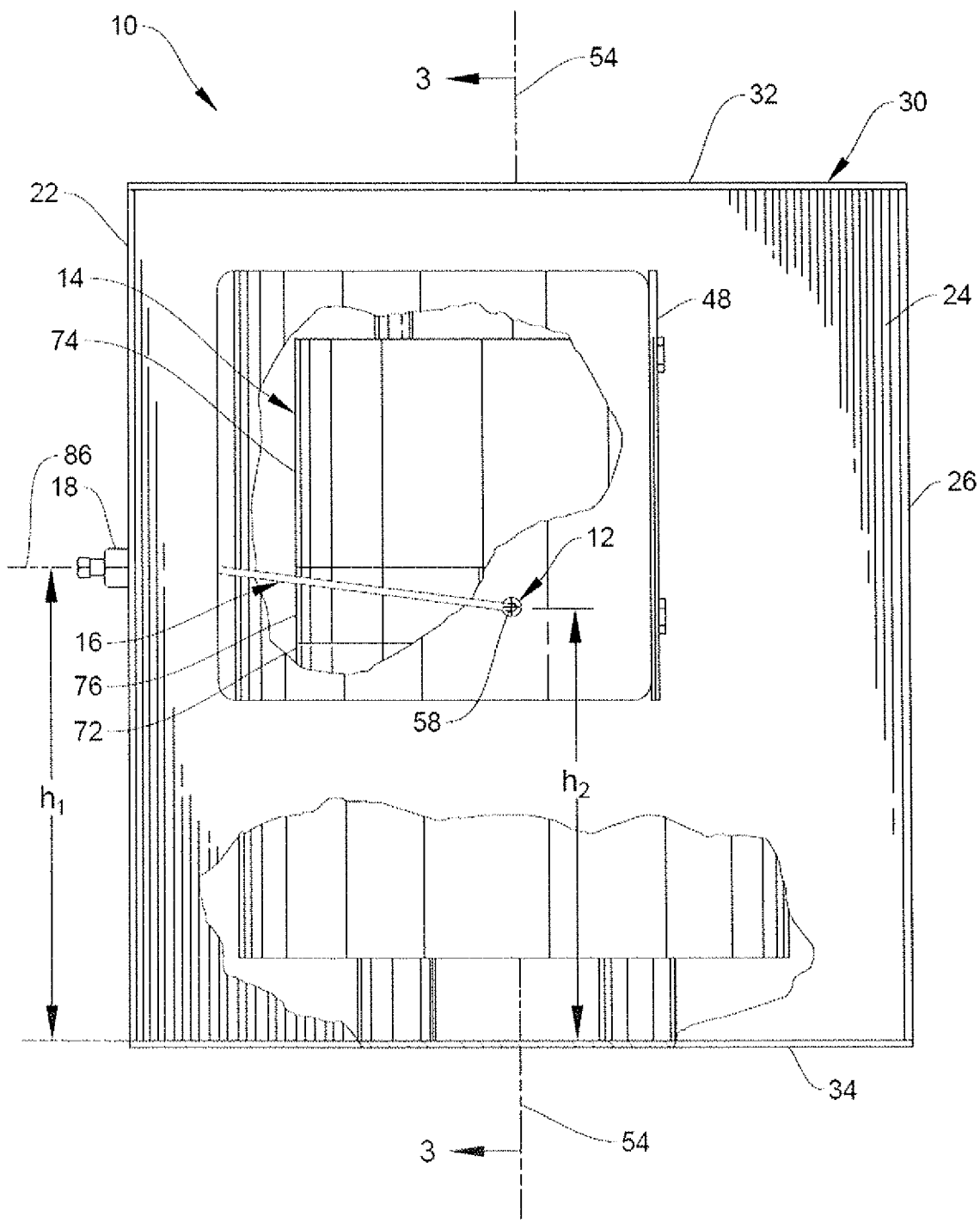
FIG. 2 is a right side elevation view of the example nuclear magnetic resonance spectrometer of FIG. 1, portions of the housing being cut away to reveal the magnetic field producing apparatus.

An example nuclear magnetic resonance (NMR) spectrometer 10 with a sample tube guide 12 is illustrated diagrammatically in FIG. 1 mounted in a magnetic field producing apparatus 14 with a removable and replaceable sample tube 16 positioned in the guide 12 and extending to two bulkhead union fittings 18, 20, which are mounted in a sidewall of a housing 30, e.g., in the front sidewall 22 in FIGS. 1 and 2. The magnetic field producing apparatus 14 can be a permanent magnet or an electro-magnet, but the example magnetic field producing apparatus 14 illustrated in FIGS. 1-3 and 5 is a permanent magnet assembly as will be described in more detail below. The NMR spectrometer 10 can be any practical size for a given spectroscopic application. The example NMR spectrometer 10, including the example magnetic field producing apparatus 14 and the example housing 30, is illustrated in FIGS. 1-5 as being of a physical size that can be set and used conveniently on a work bench or desktop. Also, the components of the example NMR spectrometer in FIGS. 1-5 are not necessarily shown to scale or in correct proportions in relation to each other. For example, the sample tube 16 and the sample tube guide 12 are small components, e.g., with small diameters, in relation to the magnetic field producing apparatus 14 and in relation to the housing 30, but it is impractical to illustrate those components in true proportions to each other in FIGS. 1-3 and 6. However, persons skilled in the art will understand the illustrated structures and components when they read and understand the descriptions in this document in conjunction with the drawings.

As shown in FIGS. 1 and 2, the example NMR spectrometer apparatus 10 includes the housing 30 around the magnetic field producing apparatus 14. The example housing 30 is illustrated in FIG. 1 as being a cuboid, i.e., box-shaped, with six flat faces (four sidewalls 22, 24, 26, 28, a top panel 32, and a bottom panel 34) and all angles being right angles, but it could be cylindrical (a curved sidewall between a top panel and a bottom panel), prism, polyhedron, or any other solid geometric shape with a base that provides a stable equilibrium and one or more sidewalls. The bulkhead union fittings 18, 20 (sometimes called bulkhead unions or just fittings) are illustrated in FIGS. 1 and 2 as being mounted in one sidewall, e.g., sidewall 22, that is parallel to the longitudinal axis 58 of the sample tube guide 12 and at a height $h_1$ above the bottom panel 34 that is greater than the height $h_2$ of the longitudinal axis 58 of the sample tube guide 12 above the bottom panel 34 as will be explained in more detail below. A first access opening 36 is provided in the sidewall 24 adjacent to a first end 40 of the sample tube guide 12, and a second access opening 38 is provided in the opposite sidewall 28 adjacent to the second end 42 of the sample tube guide 12. The access openings 36, 38 provide convenient access to the first and second ends 40, 42 of the sample tube guide 12 to facilitate insertion and removal of a sample tube 16 into and out of the sample tube guide 12 and to facilitate fastening and unfastening the first and second ends 44, 46, of the sample tube 16, respectively, to and from the first and second bulkhead unions 18, 20 inside the housing 30. An optional first door 48 is shown in FIGS. 1 and 2 for closing and opening the first access opening 36. An optional second door (not visible in FIGS. 1 and 2) is provided for closing and opening the second access opening 38. Sample supply tubes (not shown), for example, from a source of sample fluid, can be connected to the first and second bulkhead unions 18, 20 to provide a sample fluid to the sample tube 16, when the sample tube 16 is connected to the bulkhead unions 18, 20. Such bulkhead unions are well-known and available commercially from myriad vendors. One example of such bulkhead unions is part no. ZBU1, available from Valco Instruments Co., Inc., of Houston, Texas.

Figure 3:
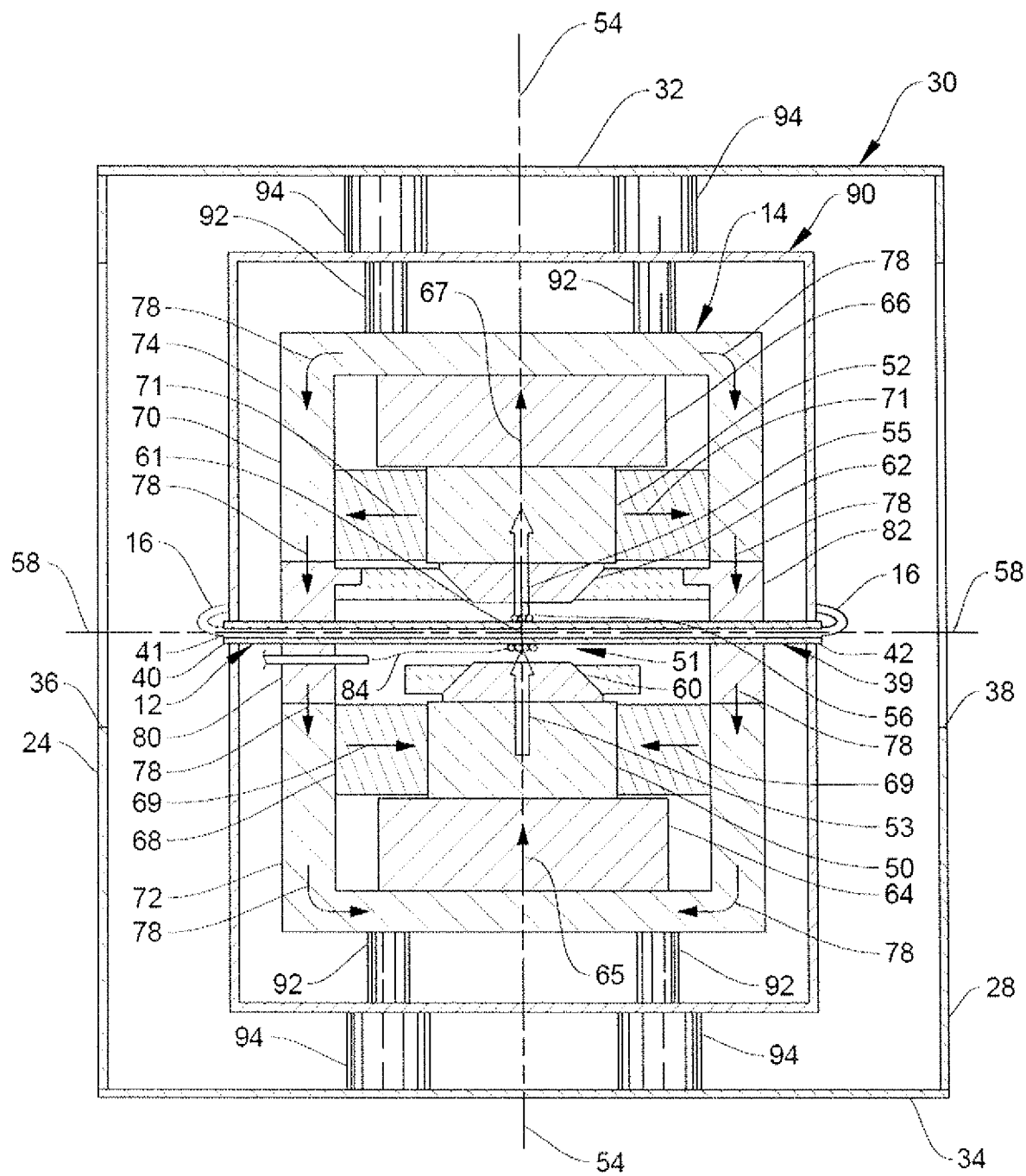
FIG. 3 is a cross-section view of the example nuclear magnetic resonance spectrometer of FIG. 1 taken in the section plane 3-3 in FIG. 2.

As mentioned above, the example magnetic field producing apparatus 14 is illustrated, for example, in FIGS. 1-3 as a permanent magnet assembly that produces a strong, uniform, magnetic field indicated by field arrows 53, 55 in FIG. 3 extending through a space 51 between a first pole formed, for example, by a first pole piece body 50 and first pole piece tip 60, and a second pole formed, for example by a second pole piece body 52 and second pole piece tip 62, such that the magnetic field 53, 55 is directed along a longitudinal axis 54 that extends through the geometric centers of the first and second poles, i.e., through the geometric centers of the first and second pole piece tips 60, 62. Persons skilled in the art know how to design and build permanent magnets to produce such strong, uniform, magnetic fields, i.e., magnetically sensitive regions, in spaces between such magnetic poles, and the variety of such known and readily available permanent magnet designs and structures are too numerous to describe here. Persons skilled in the art also know how NMR spectrometers function and how to obtain and use spectral dispersions from samples, e.g., from liquid-phase organic samples positioned in a strong magnetic field between two poles. Suffice it to say here that the sample is positioned in the strong, uniform, magnetic field 53, 55 between the two poles, e.g., between the pole piece tips 60, 62 in FIG. 3, which polarizes protons or other NMR-active nuclei in the sample. Next, one or more radio frequency (RF) pulses are applied (transmitted) with an electric coil, e.g., the electric coil 56 in FIG. 3, to the sample with frequencies at or near the resonance frequency at which the protons or other NMR-active nuclei freely precess in the uniform magnetic field 53, 55. The RF transmit pulses, transmitted by the electric coil 56 have the effect of tilting the nuclear polarization relative to the direction of the applied magnetic field 53, 55. After the transmit pulse is ended, the nuclei precess and create a time-varying magnetic field (signal) in the coil 56 that may be amplified and recorded. A particular sequence of transmit pulses, delay times, and data acquisition periods, together with all of the parameters needed to precisely define the sequence (times, frequencies, phases, acquisition rates) is known in the NMR art collectively as a pulse sequence. The design of NMR pulse sequences to extract desired information from a sample is a well-developed area of knowledge.

The best uniformity of most typical permanent magnet assemblies used for NMR devices is at the geometric center of the magnet assembly, which, in the example magnetic field producing apparatus 14 in FIGS. 1-3, is at the longitudinal axis 54 in the space 51 between the first and second pole piece tips 60, 62 (best seen in FIG. 3). Therefore, the sample being analyzed and the RF coil 56 are placed on the longitudinal axis 54 in the space 51 between the pole piece tips 60, 62 at the geometrical center 61 of the magnetic field producing apparatus 14 for best NMR signal resolution. Accordingly, as best seen in FIG. 3, the sample tube guide 12 extends through the space 51 between the pole piece tips 60, 62 in such a manner that the longitudinal axis 58 of the sample tube guide 12 intersects the longitudinal axis 54 of the magnetic field producing apparatus 14 at the geometric center 61 of the magnetic field producing apparatus 14 in order to position the sample being analyzed in the most uniform portion of the magnetic field 53, 55, i.e., at that geometric center 61 as will be explained in more detail below. Some magnetic field shimming can be used to increase uniformity (homogeneity) of the magnetic field 53, 55 produced by the magnetic assembly, if necessary or desired. Magnetic field shimming methods and apparatus are well-known in the NMR spectroscopy art.

The magnetic field producing apparatus 14 is illustrated, for example, in FIGS. 1-3 as a permanent magnet assembly, although, as mentioned above, it could also be an electromagnet (not shown). Also, as mentioned above, persons skilled in the art know how to design and construct permanent magnet apparatuses in many variations and configurations, so the particular permanent magnet apparatus illustrated in FIGS. 1-3 is for example only, and the sample tube guide 12 can be used in any number of other permanent magnet or electromagnet apparatuses that produce a region of uniform magnetic field. While many magnetic field producing apparatus are configured to produce a uniform magnetic field between two poles as illustrated for example in FIG. 3, poles are not essential. For example, some Halbach permanent magnets do not have poles.

Referring now primarily to FIG. 3 with secondary reference to FIGS. 1 and 2, the permanent magnet structure of the example magnetic field producing apparatus 14 comprises permanent magnet components that produce the strong, uniform, magnetic field 53, 55 in the space 51 between the magnet pole piece tips 60, 62. Such permanent magnet components in the example magnet field producing apparatus 14 in FIG. 3 include: (i) a first permanent magnet disk 64 positioned in longitudinal axial alignment with the first pole piece body 50 and with its magnetic flux directed axially toward the first pole piece body 50 as indicated by the flux arrow 65; (ii) a plurality of first permanent magnet sectors 68 assembled in a ring around the first pole piece body 50 and with the respective magnetic flux of each permanent magnet sector 68 directed radially inward toward the first pole piece body 50 as indicated by the flux arrows 69; (iii) a second permanent magnet disk 66 positioned in longitudinal axial alignment with the second pole piece body 52 and with its magnetic flux directed axially away from the second pole piece body 52 as indicated by the flux arrow 67; and (iv) a plurality of second permanent magnet sectors 70 assembled in a ring around the second pole piece body 52 and with the respective magnetic flux of each permanent magnet sector 70 directed radially outward away from the second pole piece body 52 as indicated by the flux arrows 71. The first and second end caps 72, 74 and a mid-ring 76 (see FIGS. 1 and 2), which together surround and enclose the above-described permanent magnet components, function as a flux return structure to guide magnetic flux efficiently from one end of the magnet assembly to the other as indicated by the flux return arrows 78 shown in FIG. 3. The permanent magnet components 50, 52, 68, and 70 (see FIG. 3) can be made of the hard magnetic material NdFeB, SmCo, or other rare-earth ceramic material or other permanent magnet material. The pole piece components, i.e., the pole piece bodies 50, 52 and the pole piece tips 60, 62 can be made of the iron-cobalt alloy known as permadur, iron, steel, or other soft magnet material. The pole piece bodies 50, 52 and pole piece tips 60, 62 can be mounted in a non-magnetic material, for example, aluminum, titanium, or a ceramic. Further details of such a permanent magnet magnetic field producing apparatus 14 can be seen, for example, in the U.S. patent application Ser. No. 16/460,783 (now issued U.S. Pat. No. 11,075,027) entitled "Permanent Magnet for Generating Homogenous and Intense Magnetic Field" filed on Jul. 2, 2019, which is incorporated herein by reference for all that it discloses.

The sample tube guide 12 illustrated in FIGS. 1-3 comprises an elongate conduit 39 with a first end 40 and a second end 42 extending along a longitudinal sample tube guide axis 58 from one lateral side of the magnetic field producing apparatus 14 through the center 61 in the space 51 between the pole piece tips 60, 62 to an opposite lateral side of the magnetic field producing apparatus 14 and having a lumen 41 through which the removable sample tube 16 can be inserted. The RF coil 56 is coiled around a portion of the sample tube guide 12 in the magnetically sensitive space 51 that extends through the center 61 of the magnetic field producing apparatus 14. The sample tube guide 12 in this example is mounted in first and second mounting blocks 80, 82 at opposite lateral sides of the magnetic field producing apparatus 14 and is made of an electrically insulating, non-ferromagnetic, material that is rigid enough to maintain its position through the center 61 of the magnetic field producing apparatus 14, including through the space 51. For example, the sample tube guide may be made of a polymer material, including, but not limited to, PTFE (polytetrafluoroethylene), PI (polyimide), PEEK (poly ether ketone), PFA (perfluoroalkoxy alkane), or PVDF (polyvinylidene fluoride, or it may be made of silicate glass. In general, to ensure the best NMR resolution, persons skilled in the art understand that care should be taken to not distort the magnetic field unnecessarily in the magnetically sensitive region where NMR signals are to be generated and detected with the RF coil 56. Accordingly, the sample guide tube 12 should be made of a material with homogenous magnetic susceptibility, and any materials placed near the region of uniform magnetic field, i.e., near the geometric center 61 of the magnetic field 53,55 in the example magnetic field producing apparatus 14, including the RF coil 56 and the sample tube guide 12, and any supporting structural material, are chosen so that they do not distort the magnetic field. Electric wire leads 84 to the RF coil 56 can routed in any convenient manner from outside the magnetic field producing apparatus 14 to the RF coil 56 in the space 51 between the pole piece tips 60, 62. Again, as mentioned above, shim coils (not shown due to space limitations in the FIG. 3 drawing) can also be mounted in the space 61 above, below, or along side the sample tube guide 12, if desired or needed to improve the magnetic field homogeneity, and thus resolution of the magnetic resonance spectrum, as is well-understood by persons skilled in the art.

The sample tube 16 size may depend on a particular application. For example, the sample tube 16 may have to be chemically compatible with a particular sample fluid, which might compromise other desirable characteristics, such as flexibility, ease of handling, or susceptibility homogeneity. That said, an inside diameter of 0.5 to 4.0 mm (millimeters) and corresponding outside diameter of 0.7 to 5.0 mm is a typical sample tube size. The example sample tube 16 may be made of a non-ferromagnetic, electrically insulating material with homogenous magnetic susceptibility to not distort the uniformity of the magnetic field 53, 55 with a lumen 41 for flowing or placing samples to be spectroscopically analyzed through the magnetic field at the center 61 in the space 51 between the pole piece tips 60, 62 for NMR spectroscopy as explained above. For example, the sample tube 16 can be made of PTFE (polytetrafluoroethylene), PEEK (poly ether ketone), PI (polyimide), PFA (perfluoroalkoxy alkane), PVDF (polyvinylidene fluoride), or other flexible, polymeric material that is chemically compatible with the sample fluid. The inside diameter of the conduit 39 of the sample tube guide 12 is just large enough to accommodate easy slippage of the sample tube 16 into and through the lumen 41 of the conduit 39. This functionality can be provided, for example, with a sample tube guide 12 that has an inside diameter about 0.1 mm to 0.2 mm larger than the outside diameter of the sample tube 16

In use, the sample tube 16 is inserted into one end, e.g., the first end 40 of the sample tube guide 12 and pushed through the sample tube guide 12 to emerge from the other end, e.g., the second end 42, as illustrated in FIGS. 1 and 3. With reference now to all of FIGS. 1, 2, and 3, the first end 44 of the sample tube 16 is then connected to the first bulkhead union 18, which is mounted in a sidewall 22 of the housing 30, and the second end 46 of the sample tube 16 is then connected to the second bulkhead union 20, which is also mounted in a sidewall 22 of the housing 30. As mentioned above, sample supply tubes (not shown), for example, from a source of sample fluid, can be connected to the first and second bulkhead unions 18, 20 to provide a sample fluid to the sample tube 16 and to flow such a sample through the sample tube 16, including through the portion of the sample tube 16 that is positioned in the center 61 of the space 51 where the RF coil 56 is positioned around the conduit 39 of the sample tube guide 12 for NMR spectroscopy analysis.

To minimize the length and fluid volume of the flow path of the sample tube 16 through the magnetic field producing apparatus 14, the flow tube guide 12 is oriented substantially horizontally in the magnetic field producing apparatus 14, so the longitudinal axis 58 of the sample tube guide 12 is substantially horizontal and substantially perpendicular to the longitudinal axis 54 of the magnetic field producing apparatus 14. To further minimize the length and fluid volume of the flow path of the sample tube 16 outside the magnetic field producing apparatus 14, the magnetic field producing apparatus 14 is positioned in the housing 30 with the substantially horizontal, longitudinal axis 58 of the flow tube guide 12 oriented substantially parallel to the sidewall 22 in which the first and second bulkhead unions 18, 20 are mounted, and first and second bulkhead unions 18, 20 are substantially the same distance apart from each other as the distance between the first and second ends 40, 42 of the sample tube guide 12. However, the first and second bulkhead unions 18, 20 can optionally be mounted in the sidewall 22 with their longitudinal flow axes 86, 88 at a height $h_1$ above the bottom panel 34 that is greater than the height $h_2$ of the longitudinal axis 58 of the flow tube guide 12 above the bottom panel 34 so that any bubbles that might be introduced into the sample fluid at the bulkhead unions 18, 20, or at other fittings in the sample supply tubes (not shown), will not be moved by buoyancy or flow forces into the magnetically sensitive space 51 between the pole piece tips 60, 62.

The magnetic field producing apparatus 14 in the example NMR spectrometer apparatus 10 is shown enclosed in a cylindrical thermal enclosure 90 that protects the magnetic field producing apparatus 14 from air currents and convection. The magnetic field producing apparatus 14 can be temperature-controlled, if desired or needed, for example, with resistive or other heaters and temperature sensors (not shown) connected to suitable temperature control circuitry (not shown) for whatever temperature is to be maintained. Such temperature control may be needed for magnetic field stability, because the magnetization of rare-earth ferromagnets is temperature-dependent. The example magnetic field producing apparatus 14 is mounted in the thermal enclosure 90 with spacers 92 that have low thermal conductivity to minimize heat flow by conduction between the magnetic field producing apparatus 14 and the thermal enclosure 90. The thermal enclosure 90 can be made with a thermally conductive material, for example, aluminum sheet, and the low thermal conductivity spacers 92 may be made, for example with polyacetal, which is a strong polymer with a low thermal conductivity. The thermal enclosure 90 and the low thermal conductivity spacers 92 together contribute to stable temperature control. The thermal enclosure 90 is mounted in the housing 30 with shock-absorbing spacers 94 for protecting the magnetic field producing apparatus 14 from jolts and vibrations, especially during transport.

Because the sample tube 16 is removable from the sample tube guide 12, it can be removed and replaced with another sample tube if the flow path in sample tube 16 becomes contaminated, obstructed, or blocked. Such removal and replacement can be accomplished without disturbing the magnet components, the RF coil 56, or any shim coils installed in the magnetic field producing apparatus 14, so minimal, if any, readjustment of the instrumentation will be needed after the sample tube 16 is replaced. This feature contributes to the convenience and flexibility of the example NMR spectrometer apparatus 10 for a variety of uses. For example, as mentioned above, a sample can be delivered by flow through the bulkhead union fittings 18, 20 from a sample fluid source (not shown), such as a chemical reactor. This mode of use can be automated readily for testing many samples. Another example, single-sample "walk-up" use may involve the user simply injecting a sample with a syringe directly into the sample tube 16 through one of the bulkhead union fittings 18, 20. Another example mode of use may involve not using the bulkhead union fittings 18, 20, and instead inserting a sample tube already containing a sample directly into the sample tube guide 12. While the latter example may not be the most desired mode of operation of the sample NMR spectrometer apparatus 10, it may be needed on occasion, for example, if a particular sample to be analyzed must be contained in a rigid glass sample tube because it is too corrosive for a polymer sample tube. In such an occasion, the flexible, polymer sample tube 16 may be removed from the sample tube guide 12, and a rigid glass sample tube, which is already filled with the sample to be analyzed and then sealed, would then be inserted into the sample tube guide 12 for NMR testing. In another occasion, a solid sample to be analyzed many be packed into a sample tube for insertion into the sample tube guide 12 for NMR analysis. In another occasion, a rigid rod of sample material to be analyzed may be inserted directly into the sample tube guide 12 for NMR analysis.

Figure 4:
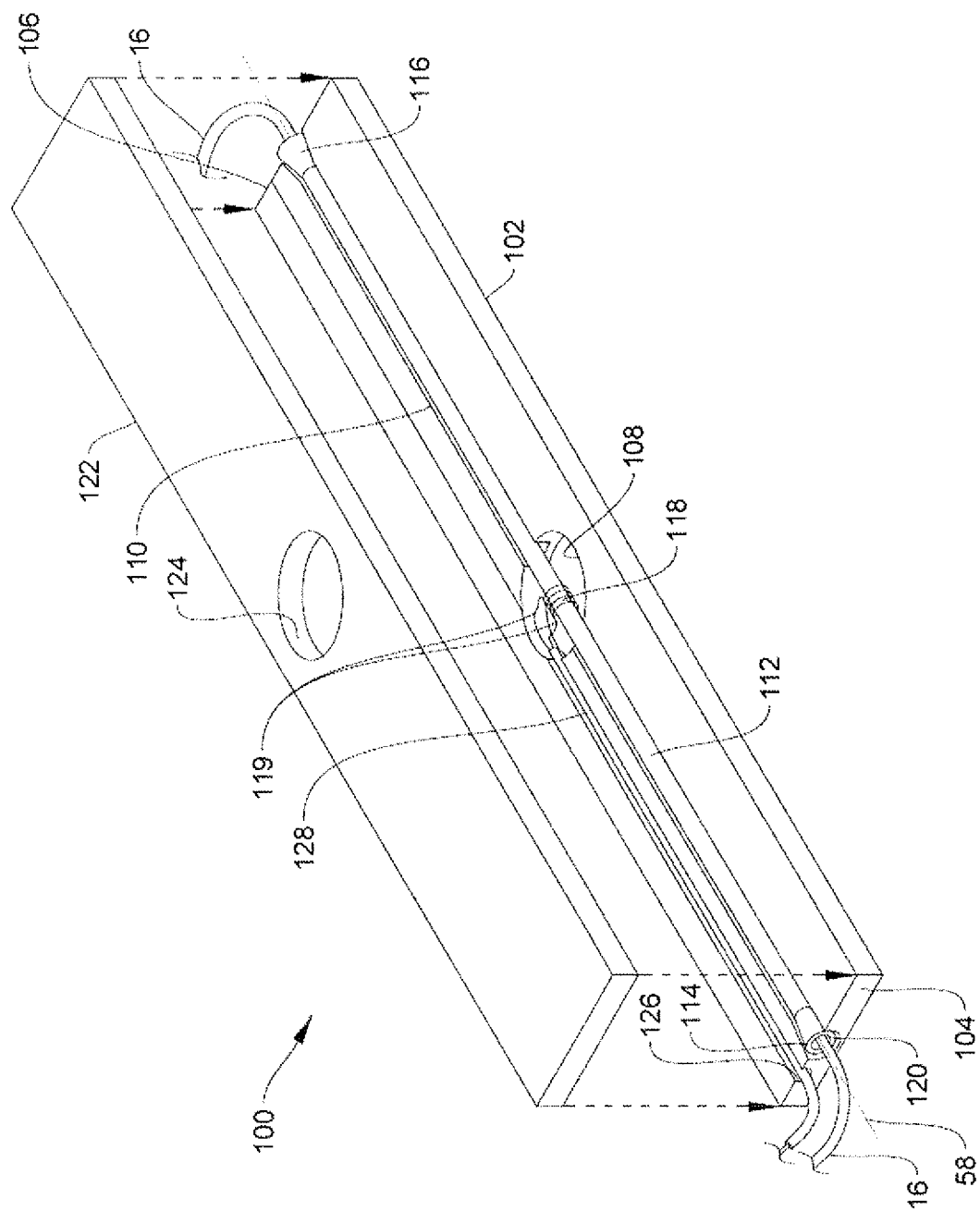
FIG. 4 is an enlarged isometric view of an alternative example embedded guide assembly with a removable sample tube shown in the guide assembly.

Another example sample tube guide 100 is illustrated diagrammatically in FIG. 4. The example sample tube guide 100 comprises an elongate substrate board 102 that has: (i) a first end 104; (ii) a second end 106 opposite the first end 104; (iii) an aperture 108 midway between the first end 104 and the second end 106; and (iv) a longitudinal guide channel 110 that extends from the first end 104 to the aperture 108 and from the aperture 108 to the second end 106. A guide conduit 112, which has a first end 114 and a second end 116, is positioned in the guide channel 110 and extends from the first end 104 of the substrate board 102, through the aperture 108, to the second end 106 of the substrate board 102. An RF coil 118 is positioned around a midportion of the guide conduit 112 that extends through the aperture 108. The guide conduit 112 has a lumen 120 with an inside diameter just large enough to accommodate easy slippage of the sample tube 16 through the lumen 120, e.g., about the same size as described above for the lumen 41 in the previously described example sample tube guide 12 in FIGS. 1-3. The removable sample tube 16 can be substantially the same as shown in FIGS. 1-3 and described above. The first and second ends 114, 116 of the guide conduit 112 can optionally be flared as shown in FIG. 4 to facilitate easy insertion of the sample tube 16 into the guide conduit 112. The tube guide 100 is positioned substantially horizontally in the magnetic field producing apparatus 14 substantially as described above for the sample tube guide 12 in FIGS. 1-3, i.e., with the guide conduit 112 extending through the geometric center 61 of the magnetic field producing apparatus 14 in the space between the pole piece tips 60, 62 and with the RF coil 118 around the portion of the guide conduit 112 that extends through the center 61.

The guide conduit 112 is made of an electrically insulating, non-ferromagnetic material, but it does not have to be rigid, because the substrate board 102 provides support for the guide conduit 112 and the guide channel 110 in the substrate board 102 keeps the guide conduit 112 straight. An adhesive (not shown) can optionally be used to fix the guide conduit 112 in the channel if desired, and this adhesive may optionally extend into or optionally fill the aperture 108. Also, an optional superstrate board 122 can be fastened onto the substrate board 102 to close the guide channel 110, as illustrated in FIG. 4, to further restrain the guide conduit 112 from deforming, bending, or moving. The superstrate board 122 also has an aperture 124 aligned with the aperture 108 in the substrate board 102 to minimize or eliminate interference with the magnetic field 53, 55 in the space 51 between the pole piece tips 60, 62 (FIG. 3). If an adhesive is used, as mentioned above, such adhesive may also optionally extend into or fill the aperture 124 in the superstrate board 122. An optional auxiliary channel 126 can be provided in the substrate board 102 parallel to the guide channel 110 and extending from the first end 104 of the substrate board 102 to the aperture 108 to accommodate electric connections to the leads 119 of the RF coil 118, for example, with a coax cable 128. Again, shim coils (not shown) can be added in the space 51 between the pole piece tips 60, 62 if desired or needed to improve homogeneity of the magnetic field 53, 55 in space 51 (FIG. 3), as is well-known by persons skilled in the art. For example, shim coils (not shown) could be added to the substrate board 102 or to the superstrate board 122 or in additional boards in a manner similar to the shim coils described in the United States Patent Application Publication No. US 2012/0001636 A1 (now issued U.S. Pat. No. 8,847,596) entitled "Capillary Cartridge For Miniaturized Nuclear Magnetic Resonance (NMR) Devices," which is incorporated by reference herein for all that it discloses.

Figure 5:
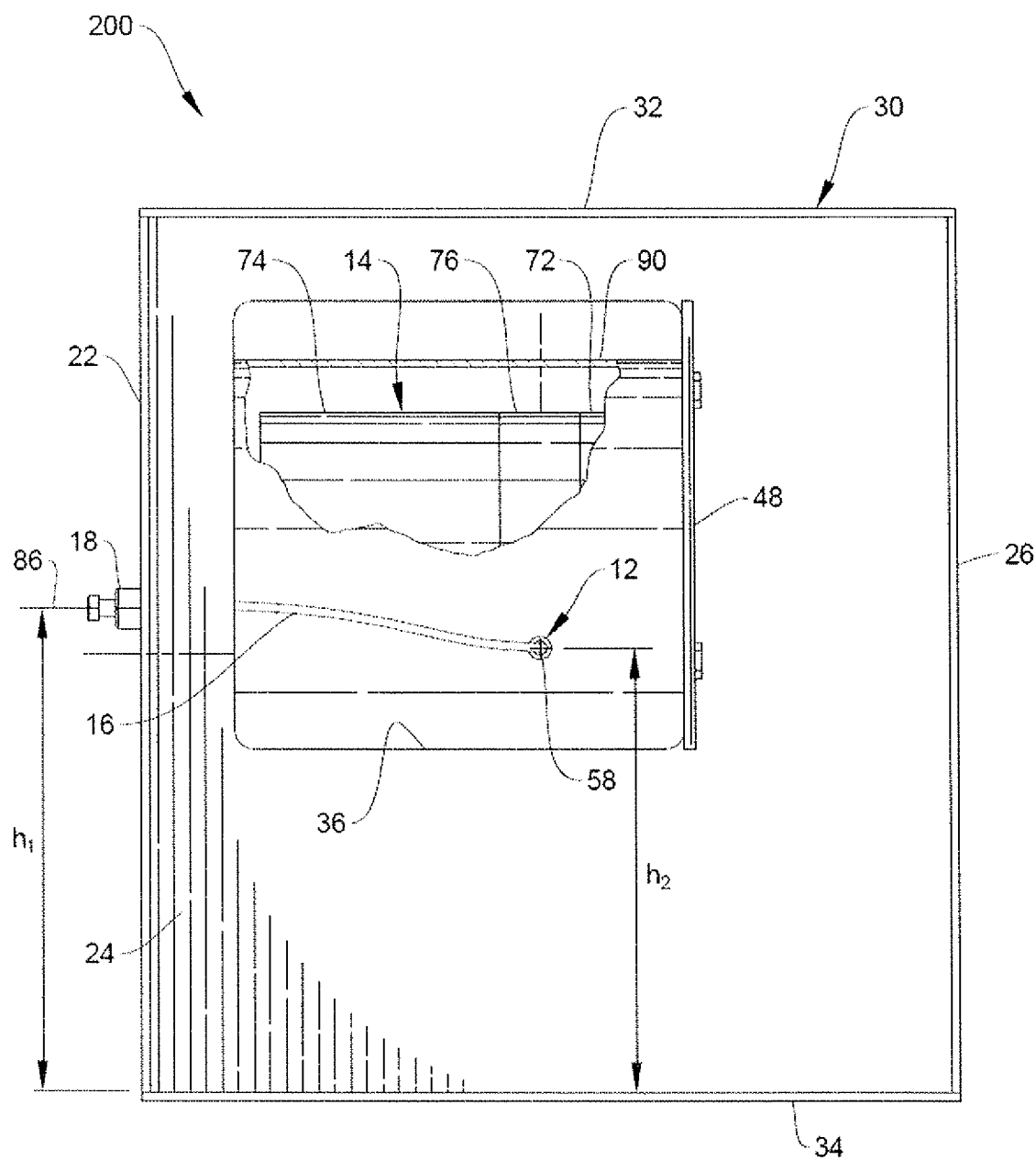
FIG. 5 is a right side elevation view of an example alternative magnet orientation.

Another example NMR spectrometer apparatus 200 illustrated diagrammatically in FIG. 5 is substantially the same as the example NMR apparatus 10 in FIGS. 1-3, except that the magnetic field producing apparatus 14 is mounted in the housing 30 with the longitudinal axis 54 of the magnetic field producing apparatus 14 oriented substantially horizontally, although still substantially perpendicular to the substantially horizontal, longitudinal axis 58 of the sample tube guide 12. Again, as explained above for the example NMR spectrometer apparatus 10 in FIGS. 1-3, the first and second bulkhead unions 18, 20 in the example NMR spectrometer apparatus 200 (only bulkhead union 18 is visible in FIG. 5) can optionally be mounted in the sidewall 22 with their longitudinal flow axes 86, 88 (only flow axis 86 is visible in FIG. 5) at a height $h_1$ above the bottom panel 34 that is greater than the height $h_2$ of longitudinal axis 58 of the flow tube guide 12 above the bottom panel 34 so that any bubbles in the sample fluid will not be moved by buoyancy or flow forces into the magnetically sensitive space 51 between the pole piece tips 60, 62 (see FIG. 3).

As explained above, the examples shown in the drawings and described above are not the only possible implementations. Accordingly, resort may be made to all suitable combinations, subcombinations, and modifications that fall within the scope of the descriptions herein. The words "comprise," "comprises," "comprising," "include," "including," and "includes" when used in this specification, including the claims, are intended to specify the presence of stated features, integers, components, or steps, but they do not preclude the presence or addition of one or more other features, integers, components, steps, or groups thereof.

We claim:

1. NMR spectrometer apparatus, comprising:
magnetic field producing apparatus comprising a pair of magnetic poles spaced apart from each other along a longitudinal magnet axis to provide a magnetic field in a magnetically sensitive space between the magnetic poles;
an elongate sample tube guide of non-ferromagnetic material extending through the magnetically sensitive space between the magnetic poles along a horizontal sample tube guide axis that is perpendicular to the longitudinal magnet axis, said sample tube guide extending from one lateral side of the magnet field producing apparatus to an opposite lateral side of the magnetic field producing apparatus and having a lumen through which a removable sample tube can be inserted to extend into the magnetically sensitive space, and
a radio frequency coil around the sample tube guide in the magnetically sensitive space.

2. The NMR spectrometer apparatus of claim 1, including a housing around the magnetic field producing apparatus, the housing comprising:
a lateral sidewall;
a first union fitting mounted in and extending through the lateral sidewall, the first union fitting being configured for connection of a first end of a sample tube to the first union fitting inside the housing;
a second union fitting mounted in and extending through the lateral sidewall, the second union fitting being configured for connection to a second end of the sample tube to the second union fitting inside the housing; and
one or more access openings in the housing positioned to accommodate access to the first union fitting and the second union fitting inside the housing for connecting and disconnecting the sample tube to and from the first union fitting and the second union fitting inside the housing.

3. The NMR spectrometer apparatus of claim 2, wherein the first union fitting and the second union fitting are higher in the housing than the horizontal sample b axis.

4. The NMR spectrometer apparatus of claim 1, wherein the magnetic field producing apparatus is positioned in the housing with the magnet axis oriented in a substantially vertical direction.

5. The NMR spectrometer apparatus of claim 1, wherein the magnetic field producing apparatus is positioned in the housing with the magnet axis oriented in a substantially horizontal direction.

6. The NMR spectrometer apparatus of claim 2, wherein the magnetic field producing apparatus is positioned in the housing with the horizontal sample tube guide axis oriented parallel to the sidewall.

7. The NMR spectrometer apparatus of claim 3, wherein the sample tube is elongate and flexible having a first end and a second end, and wherein the elongate, flexible sample tube extends in a removeable manner through the sample tube guide with the first end connected to the first union fitting and the second end connected to the second union fitting.

8. NMR spectrometer apparatus, comprising:
magnetic field producing apparatus comprising ferromagnetic materials arranged in a manner that produces a region of homogeneous magnetic field along a longitudinal magnetic field axis;
an elongate sample tube guide of non-ferromagnetic material extending through the region of homogeneous magnetic field along a horizontal sample tube guide axis that is perpendicular to the longitudinal magnet field axis, said sample tube guide extending from one lateral side of the magnet field producing apparatus to an opposite lateral side of the magnetic field producing apparatus and having a lumen through which a removable sample tube can be inserted to extend into the region of homogeneous magnetic field, and
a radio frequency coil around the sample tube guide in the region of the homogeneous magnetic field.

9. The NMR spectrometer apparatus of claim 8, including a housing around the magnetic field producing apparatus, the housing comprising:
a lateral sidewall;

a first union fitting mounted in and extending through the lateral sidewall, the first union fitting being configured for connection of a first end of a sample tube to the first union fitting inside the housing;

a second union fitting mounted in and extending through the lateral sidewall, the second union fitting being configured for connection to a second end of the sample tube to the second union fitting inside the housing; and one or more access openings in the housing positioned to accommodate access to the first union fitting and the second union fitting inside the housing for connecting and disconnecting the sample tube to and from the first union fitting and the second union fitting inside the housing.

10. The NMR spectrometer apparatus of claim 9, wherein the first union fitting and the second union fitting are higher in the housing than the horizontal sample tube guide axis.

11. The NMR spectrometer apparatus of claim 8, wherein the magnetic field producing apparatus is positioned in the housing with the magnet field axis oriented in a substantially vertical direction.

12. The NMR spectrometer apparatus of claim 8, wherein the magnetic field producing apparatus is positioned in the housing with the magnet field axis oriented in a substantially horizontal direction.

13. The NMR spectrometer apparatus of claim 9, wherein the magnetic field producing apparatus is positioned in the housing with the horizontal sample tube guide axis oriented parallel to the sidewall.

14. The NMR spectrometer apparatus of claim 10, wherein the sample tube is elongate and flexible and has a first end and a second end, and wherein the elongate, flexible sample tube extends in a removeable manner through the sample tube guide with the first end connected to the first union fitting and the second end connected to the second union fitting.

15. An improvement in apparatus for NMR spectrometer analysis of a sample, wherein the apparatus includes magnetic field producing means for producing a magnetic field with a magnetic field axis and an RF coil positioned in the magnetic field at the magnetic field axis, the improvement comprising:

an elongate sample tube guide extending along a sample tube guide axis that is perpendicular to the magnetic field axis and that intersects the magnetic field axis, said elongate sample tube guide extending through the RF coil at the magnetic field axis and having a lumen that is sized to removably receive a sample tube inside the sample tube guide where the sample tube guide axis intersects the magnetic field axis.

\* \* \* \* \*